United States Patent
Schuster et al.

(10) Patent No.: US 6,243,846 B1
(45) Date of Patent: *Jun. 5, 2001

(54) FORWARD ERROR CORRECTION SYSTEM FOR PACKET BASED DATA AND REAL TIME MEDIA, USING CROSS-WISE PARITY CALCULATION

(75) Inventors: Guido M. Schuster, Des Plaines; Michael Borella, Naperville; Jerry Mahler, Prospect Heights; Ikhlaq Sidhu, Buffalo Grove, all of IL (US)

(73) Assignee: 3Com Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/062,435

(22) Filed: Apr. 17, 1998

Related U.S. Application Data

(63) Continuation-in-part of application No. 08/989,616, filed on Dec. 12, 1997, now Pat. No. 6,145,109, and a continuation-in-part of application No. 08/989,483, filed on Dec. 12, 1997, now Pat. No. 5,870,412, and a continuation-in-part of application No. 08/993,505, filed on Dec. 18, 1997, now Pat. No. 6,170,075, and a continuation-in-part of application No. 09/018,872, filed on Feb. 5, 1998, now Pat. No. 6,516,636.

(51) Int. Cl.[7] .................................................. H03M 13/00
(52) U.S. Cl. .............................................. 714/776; 714/757
(58) Field of Search ........................ 348/423, 6; 382/239; 714/752, 774, 781, 775, 753, 755, 776, 757

(56) References Cited

U.S. PATENT DOCUMENTS

| 5,115,436 | * | 5/1992 | McAuley | 714/781 |
|---|---|---|---|---|
| 5,428,629 | | 6/1995 | Gutman et al. | 371/37.1 |
| 5,583,562 | | 12/1996 | Birch et al. | 348/12 |
| 5,600,663 | * | 2/1997 | Ayanoglu et al. | 714/774 |
| 5,608,738 | * | 3/1997 | Matsushita | 714/752 |
| 5,617,541 | | 4/1997 | Albanese et al. | 395/200.13 |
| 5,699,369 | | 12/1997 | Guha | 371/41 |
| 5,703,887 | * | 12/1997 | Heegard et al. | 714/775 |
| 5,757,416 | * | 5/1998 | Birch et al. | 348/6 |
| 5,828,788 | * | 10/1998 | Chiang et al. | 382/239 |
| 5,831,690 | * | 11/1998 | Lyons et al. | 348/423 |
| 5,993,056 | * | 11/1999 | Vaman et al. | 714/753 |
| 6,079,042 | * | 6/2000 | Vaman et al. | 714/755 |

FOREIGN PATENT DOCUMENTS

WO 97/38549   10/1997   (WO).

OTHER PUBLICATIONS

Shacham, N. et al., "Packet Recovery in High–Speed Networks Using Coding and Buffer Management", Information and Telecommunication Sciences Center SRI Int'l, Infocom 1990 Conference Publication.

Blaum, M. et al. Evenodd: An Optiaml Scheme for Tolerating Double Disk Failures in RAID Architectures. In Proceedings of the 1994 International Symposium on Computer Architecture. pp. 245–254, 1994.

(List continued on next page.)

Primary Examiner—Albert Decady
Assistant Examiner—David Ton
(74) Attorney, Agent, or Firm—McDonnell Boehnen Hulbert & Berghoff

(57) ABSTRACT

A computationally simple yet powerful forward error correction code scheme for transmission of real-time media signals, such as digitized voice, video or audio, in a packet switched network, such as the Internet. For each window of k data packets, the invention generates and transmits at least one cross-wise parity packet taken as an index-shifted function over the k data packets. The invention thereby enables a receiving end to recover from packet loss.

29 Claims, 3 Drawing Sheets

Microfiche Appendix Included
(1 Microfiche, 45 Pages)

OTHER PUBLICATIONS

Gibson, G.A. et al. Failure Correction Techniques for Large Disk Arrays. In Proceedings of the 3$^{rd}$ International Conference on Architectural Support for Programming Language and Operating Systems. pp. 123–132, 1989.

Schwabe, E.J. et al. Flexible Usage of Parity Storage Space in Disk Arrays. In Proceedings of the 1996 ACM Symposium on Parallel Algorithms and Architectures. 1996.

Sutherland, I. High Performance Fault–Tolerant Disk Arrays. UMI Disseration Services. 1996.

Fuja et al., "Cross Parity Check Convolutional Codes", 1989 IEEE, pp. 1264–1276.*

Shacham N., "Packet Recovery and Error Correction in High–Speed Wide–Area Networks", *1989 IEEE,* pp. 0551–0557.

McAuley, Anthony J., "Reliable Broadband Communication Using a Burst Erasure Correcting Code," Computer Communication Review 20(1990) Sep., No. 4, New York, US, pp. 297–306.

Sherman, Ken, "Packet Switching," Data Communications (1990), chapter 17, pp. 384–407.

Kalathur, R., et al., "Forward Error Correction with Buffer Management in Multimedia ATM Networks" Southcon/94 Conference Record, 1994, pp.437–444.

Aghadavoodi Jolfaei, M. et al., "Improved Selective Repeat ARQ Schemes for Data Communication," Proceedings of the Vehicular Technology Conference, Stockholm, vol. 3, No. Conf. 44, pp. 1407–1411 (Jun. 8–10, 1994).

Feher, Kamilo, "Coding: Error Correction and Detection," in Wireless Digital Communications: Modulation and Spread Spectrum Applications, (1995), chapter 5, Prentice–Hall PTR, Upper Saddle River, New Jersey, pp. 254–284.

Nonnenmacher, Jorg et al., "Parity–Based Loss Recovery for Reliable Multicast Transmission," (1997), pp. 289–300.

Bolot, Jean–Chrysostome et al., "Adaptive Error Control for Packet Video in the Internet", Proceedings of IEEE International Conference on Image Processing, Sep., 1996.

Budge, D. et al., "Media–Independent Error Correction Using RTP", Audio–Video Transport Working Group— Internet Draft, May 1997, pp. 1–17.

Silbiger, Herman R., Draft New Recommendation T.38 (T.lfax2): "Procedures for Real Time Group 3 Facsimile Communication Between Terminals Using IP Networks," International Telecommunication Union, Telecommunication Standardization Sector, COM 8–50–E (Feb. 1998).

International Search Report for PCT Application Serial Number PCT/US98/26421, dated Jul. 7, 1999.

* cited by examiner

FORWARD ERROR CORRECTION SYSTEM FOR PACKET BASED DATA AND REAL TIME MEDIA, USING CROSS-WISE PARITY CALCULATION

RELATED APPLICATIONS

The present application is a continuation-in-part of the following applications, the entirety of each of which is expressly incorporated herein by reference:

U.S. patent application Ser. No. 08/989616, entitled "A Forward Error Correction System for Packet Based Real Time Media," and filed Dec. 12, 1997, by the present inventors and assigned to the owner of the present invention, now U.S. Pat. No. 6,145,109.

U.S. patent application Ser. No. 08/989483, entitled "A Forward Error Correction System for Packet Based Real Time Media," and filed Dec. 12, 1997, by the present inventors and assigned to the owner of the present invention, now U.S. Pat. No. 5,870,412.

U.S. patent application Ser. No. 08/993,505, entitled "Data and Real-Time Media Communication Over a Lossy Network," filed Dec. 18, 1997, by the present inventors and assigned to the owner of the present invention, now U.S. Pat. No. 6,170,075.

U.S. patent application Ser. No. 09/018872, entitled "Data and Media Communication Through a Lossy Channel Using Signal Conversion," filed Feb. 5, 1998, by the present inventors and assigned to the owner of the present invention, now U.S. Pat. No. 6,151,636

COPYRIGHT

A portion of the disclosure of this patent document contains material that is subject to copyright protection. The copyright owner has no objection to the facsimile reproduction by anyone of the patent disclosure, as it appears in the Patent and Trademark Office patent files or records, but otherwise reserves all copyright rights whatsoever.

MICROFICHE APPENDIX

This patent document includes a microfiche appendix, containing one sheet of microfiche and a total of 45 frames.

BACKGROUND OF THE INVENTION

1. Field of the Invention

The present invention relates to packet switched telecommunications networks and more particularly to a system for correcting loss of data packets in such a network.

2. Description of the Related Art

In a packet switched network, a message to be sent is divided into blocks, or data packets, of fixed or variable length. The packets are then sent individually over the network through multiple locations and then reassembled at a final location before being delivered to a user at a receiving end. To ensure proper transmission and re-assembly of the blocks of data at the receiving end, various control data, such as sequence and verification information, is typically appended to each packet in the form of a packet header. At the receiving end, the packets are then reassembled and transmitted to an end user in a format compatible with the user's equipment.

A variety of packet switching protocols are available, and these protocols range in degree of efficiency and reliability. Those skilled in the art are familiar, for instance, with the TCP/IP suite of protocols, which is used to manage transmission of packets throughout the Internet. One of the protocols within the TCP/IP suite, for example, is TCP.

TCP is a reliable connection-oriented protocol, which includes intelligence necessary to confirm successful transmission between sending and receiving ends in the network. According to TCP, each packet is marked in its header with a sequence number to allow the receiving end to properly reassemble the packets into the original message. When a packet arrives at the destination, the receiving TCP entity should send back to the sending entity a packet bearing an acknowledgement number equal to the next sequence number that it expects to receive. If the sending entity does not receive an acknowledgement within a specified time period, it will re-transmit the package of data.

Generally speaking, this acknowledgment and re-transmission system works well to correct packet loss in the Internet. However, the system can unfortunately delay the complete transmission of a data stream. For the transmission of packets representing pure data signals such as e-mail messages, transmission delay is not ideal, although it is of secondary concern compared to an unrecoverable loss of information. Real-time media signals (especially compressed signals), however, are by definition highly sensitive to delay and will appear jumpy, interrupted or otherwise distorted if parts of the signal do not flow continuously to the receiving end. Therefore, although the loss of packets in a real time media transmission over the Internet has been correctable, the resulting signals have often nevertheless been of unacceptable quality.

SUMMARY OF THE INVENTION

The present invention provides a computationally simple yet powerful system for handling packet loss that may arise in the communication of data or real time media signals, such as digitized voice, video or audio, in a packet switched network. The invention generates and transmits into the network one or more forward error correction codes, or parity packets, at least one of which is defined by taking a cross-wise XOR sum of a predetermined number of preceding payload packets. In turn, a receiving end may extract lost payload from this redundant information and may correct for the loss of multiple packets in a row.

Various features and advantages of the present invention will become apparent to those of ordinary skill in the art by reading the following detailed description, with appropriate reference to the accompanying drawings.

BRIEF DESCRIPTION OF THE DRAWINGS

A preferred embodiment of the present invention is described herein with reference to the drawings, in which.

DETAILED DESCRIPTION OF THE PREFERRED AND ALTERNATIVE EMBODIMENTS

Figure 1:
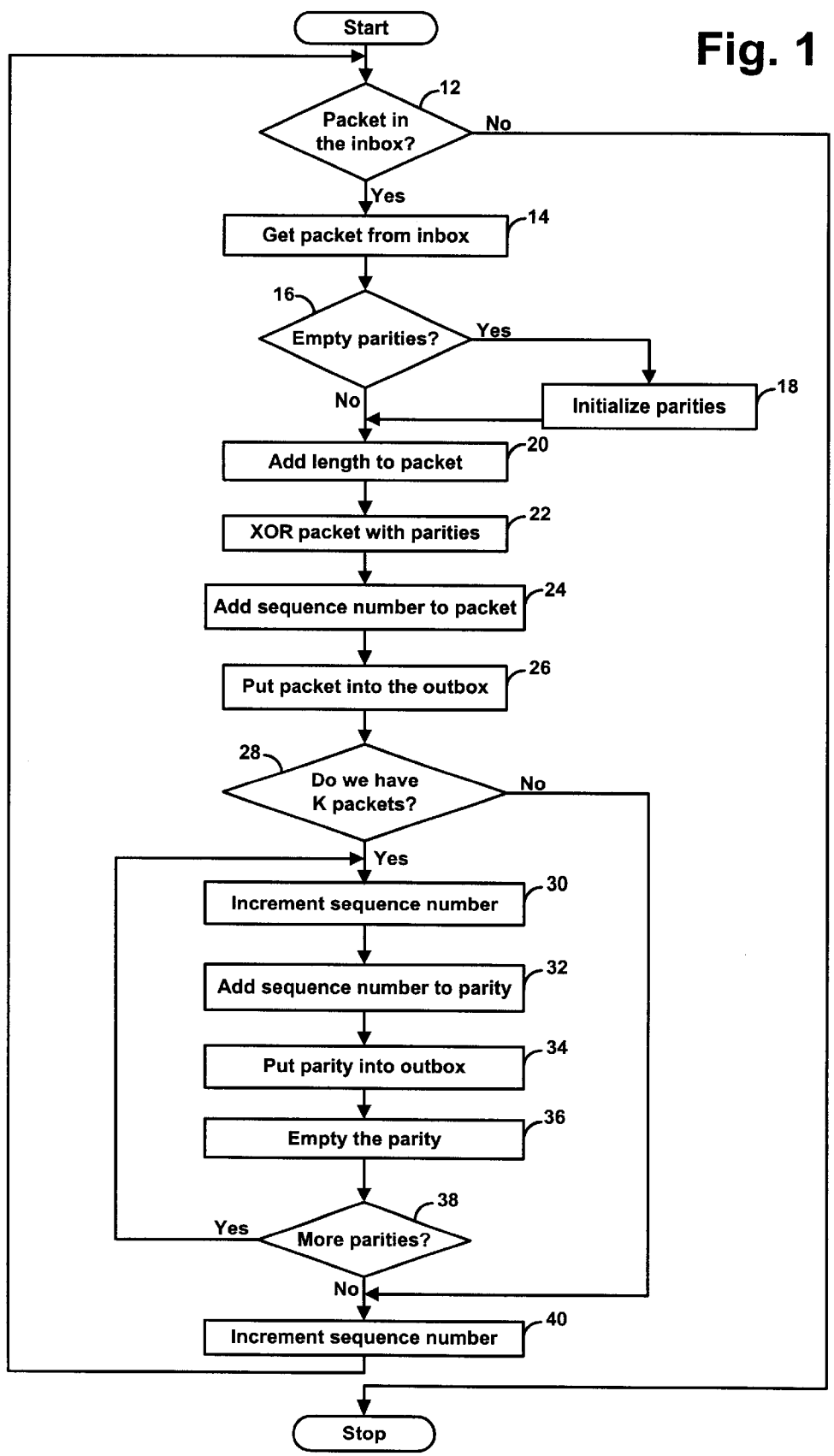
FIG. 1 depicts the process flow of an encoder operating in accordance with a preferred embodiment of the present invention.

The present invention provides an improved system for communicating substantially real time media signals through an unreliable digital transmission channel. The invention may find particular use for transmission of digitized video or audio (including, for instance, voice) signals over the Internet but will apply equally well to the transmission of other types of signals (such as, for example, pure data signals like e-mail messages) and the transmission over other types of communication channels (such as, for example, an internet or other computer network). In the preferred embodiment, the invention employs a computationally simple error correction scheme that enables the recovery of lost data packets within specified limits, while beneficially adding very little delay in transmission time.

For purposes of illustration, the following description will assume that an audio or video signal has been converted into a digital data stream and is to be transmitted in a network from a first node to a second node. It will be appreciated, of course, that the invention is not restricted to use in a traditional network configuration but may extend to any communication path through which a sequence of packets are transmitted, including, for instance, a direct path. In the preferred embodiment, however, the signal at issue is to be transmitted between nodes of a network such as the Internet.

The description will further assume by way of example that the digital data stream, or payload, has been divided into a sequence of frames or data packets, $D_0, D_1, D_2, D_3 \ldots D_i$. In this example, each of these data packets consists of a set number of bits, bytes or words (or other such data elements) and preferably represents a portion of a signal to be transmitted through a network.

This description additionally assumes by way of example that the packets may be transmitted in a network according to a packet switching protocol that employs a bit-wise or other high resolution verification scheme such as a checksum or parity bit. Therefore, it will be assumed that a technique may be in place to respond to loss of some portion of a successfully transmitted packet (such as, for example, one bit of an 8-bit packet). Remaining at issue, then, is how to correct for loss of one or more entire packets as identified, for instance, by their sequence numbers.

As discussed in the Background section above, the TCP protocol offers one method for responding to loss of packets in a digital transmission network. According to TCP, the receiving node may be configured to acknowledge receipt of packets, and the sending end will re-transmit any packet as to which it does not receive an acknowledgement. This request and retransmission system is generally accurate. However, as noted above, the system is not well suited for use in the context of real-time media transmissions, because the transmission of such signals is very sensitive to the delay introduced by retransmission requests.

Rather than employing (or invoking) an acknowledgement and retransmission system, greater efficiency in packet loss correction may be achieved by transmitting a correction code of some sort concurrently with the payload data, thereby providing the receiving end with sufficient information to recover lost packets. Several error correction code mechanisms are available for this purpose. These mechanisms include, for instance, interleaving and block coding.

Interleaving is commonly used in wireless communications, providing an effective method to combat error bursts that occur on a fading channel. Interleaving generally calls for spreading the bits of each codeword (or data packet) apart from each other so they experience independent loss and so that the original data may be more readily recovered.

Block coding, in turn, calls for mapping a frame of binary source data into a coded block of data that includes a set of redundant parity symbols. By conventional terminology, a block coder typically converts a group of k payload units (such as bytes or bits) into a larger group of n units by appending p=n−k parity units or forward error correction (FEC) codes to the group. Each parity packet is generated through a predetermined coding technique based on all or some subset of the k payload units. One of the simplest forms of a block code is a repetition code, in which the binary source data is repeated as a set of parity bits. One of the more popular but complex block codes is the Reed-Solomon (RS) class of codes over the $2^8$ Galois field. These codes are optimal in their ability to correct erased bytes. For example, provided that 8 bytes are protected with 3 parity bytes (a total of 11 bytes), any three bytes can be lost, and the original 8 bytes may still be recovered.

Unfortunately, however, the addition of redundant parity packets gives rise to increased complexity and delays in transmission. In a packet switched network, routers route packets based on information contained in the packet headers. Therefore, the amount of work performed by a packet router generally relates directly to the number of packets being routed. Because each packet, whether payload or parity, contains its own header, an increase in packet rate consequently increases the burden on network routers and could delay transmission time or, in theory, cause a network to fail.

Adding separate parity packets to the transmission sequence is a particular waste of resources when done in the context of some of the more common real-time media transmission protocols, because many of the existing protocols add substantial overhead to each packet. For instance, the G.723.1 voice coder provides 24 bytes of payload every 30 milliseconds. These 24 bytes are then put into an RTP packet, which in turn is put into a UDP packet, which in turn is put into an IP packet, so that the total packet length is now 24+16+8+20=68 bytes. A parity packet destined for the same receiving end as an adjacent payload block would have a header almost identical to the header of the payload block. Yet the parity packet would still require the full 44 bytes of overhead, resulting in a waste of bandwidth. As this example illustrates, traditional block coding techniques are therefore not well suited for correcting packet loss in real time media transmissions.

To avoid an increase in packet rate, another technique for providing parity information is to append redundant parity information to existing data packets. For instance, as an offshoot of traditional repetition codes, the transmitting node may append to each data packet redundant copies of the preceding k number of data packets. In this way, the receiving end may readily recover a lost packet $D_i$ from one of the k subsequent packets $D_{i+1} \ldots D_{i+k}$. For instance, with k=2, data packets $D_{i-1}$ and $D_{i-2}$ would be redundantly appended to and transmitted together with data packet $D_i$, providing the following transmission packets $P_k$, for example:

$P_1 = \{D_1 D_0, D_{-1}\}$ $P_2 = \{D_2, D_1, D_0\}$ $P_3 = \{D_3, D_2, D_1\}$ $P_4 = \{D_4, D_3, D_2\}$ $P_5 = \{D_5, D_4, D_3\}$ $P_6 = \{D_6, D_5, D_4\}$ $P_7 = \{D_7, D_6, D_5\}$ $P_8=\{D_8, D_7, D_6\}$ $P_9=\{D_9, D_8, D_7\}$

\*\*\*

$P_i=\{D_i, D_{i-1}, D_{i-2}\}$

With this scheme, in the event a data packet is lost in transmission, the receiving end may simply extract a redundant copy of the payload from one of the k subsequent data packets.

By appending k preceding data packets to each current data packet $D_i$, it becomes possible to recover k lost packets in a row without having to request retransmission. As more preceding packets are concatenated with each current packet, the network can tolerate a higher rate of packet loss. Additionally, this method will not affect the packet rate or routing rate, since, as noted above, the routing rate is concerned principally with the header information in a given packet, rather than with the size of each packet. Unfortunately, however, by concatenating multiple data packets, this method necessarily and substantially increases the data rate. For instance, to be able to correct for two lost packets in a row (k=2) this method triples the payload of every packet. This is only acceptable if the payload is a fraction of the header information. Therefore, this method is not desirable for packets with substantial payload sizes.

As described in parent application Ser. No. 08/989,616, filed Dec. 12, 1997, which has been incorporated herein by reference, a suitable and less costly scheme of correcting for packet loss involves employing a coding technique in which parity bits associated with current packets are piggy-backed onto future packets. In particular, as a sequence of payload blocks is being transmitted, every k payload blocks in the sequence are fed through a block coder to create p=n−k forward error correction (FEC) codes or parity packets, where p≦k. These p parity packets are then concatenated respectively with the next p data packets being transmitted. In turn, at the receiving end, if a packet is lost, the associated payload may be extracted from the parity blocks carried by the appropriate packets.

Cross-wise Parity Packets

While a packet transmission system may employ substantially any FEC coder to create the required p parity packets for each group of k data packets, the present invention introduces a new and improved, computationally simple FEC coding (and decoding) scheme. According to a preferred embodiment of the present invention, a coder may generate p parity packets based on each window of k data packets, with at least one of the p parity packets being a "cross-wise" parity packet. Generally speaking, a "cross-wise" parity packet is a parity packet derived from a predetermined functional combination of the k data packets along an index shifted path. In contrast, a "straight" parity packet is a parity packet derived from a combination of the k data packets without index shifting.

To appreciate these definitions, consider first that each of the k data packets in a window is made up of data elements, such as bits, bytes, words, or the like. Each of these data elements may be referenced by an index. For instance, but without limitation, the most significant element of each data packet might have an index of 0, the next most significant element might have an index of 1, and so forth. Alternatively, the data elements may be referenced by other indexes, provided that the reference system is consistent among all of the data packets in a given window. For purposes of example, assume that k=2 and that the two data packets are $D_A=\{D_A(1), D_A(2), D_A(3)\}$, and $D_B=\{D_B(1), D_B(2), D_B(3)\}$.

Assume next that the k data packets are placed in a table with each packet defining one row, and the correspondingly indexed data elements of the data packets defining columns. In the present example, the first row would contain data packet $D_A$, and the second row would contain data packet $D_B$. In turn, the first column would contain data elements $D_A(1)$ and $D_B(1)$, the second column would contain data elements $D_A(2)$ and $D_B(2)$, and the third column would contain data elements $D_A(3)$ and $D_B(3)$.

A "straight" parity packet derived from these data packets would be computed on an element-by-element basis straight along the columns of the table. For instance, if the straight parity packet is derived by the function of adding the two data packets, the resulting straight parity packet $P_{STRAIGHT(A+B)}$ might be:

$P_{STRAIGHT(A+B)}\{[D_A(1)+D_B(1)], [D_A(2)+D_B(2)], [D_A(3)+D_B(3)]\}$.

Thus, the first data element of the parity packet is a combination of the first elements of both data packets, the second element of the parity packet is a combination of the second elements of both data packets, and so forth. In summary, to derive a straight parity packet, the indexes of the data elements need not be shifted relatively between the various data packets.

On the other hand, a "cross-wise" parity packet derived from these data packets would be computed as a function that crosses the columns of the table in some way, thereby following an index-shifted path through the data elements of the packets. For instance, if the cross-wise parity packet is derived by the function of adding the two data packets along a −45° diagonal line, the resulting cross-wise parity packet $P_{CROSS(A+B)}$ might be:

$P_{CROSS(A+B)}=\{[D_B(1)], [D_A(1)+D_B(2)], [D_A(2)+D_B(3)], [D_A(3)]\}$.

By way of example, the second data element of this parity packet is a combination of the first element of the first data packet and the second element of the second data packet. This parity packet thus results from the index shifted combination of elements of the data packets.

Overview of Preferred Encoding/Decoding Operation

According to the preferred embodiment, an encoder will derive three different types of parity packets from each group of k data packets and append those parity packets respectively to the packets in the next group of k data packets. The three types of parity packets may be referred to respectively as a "straight" packet (PS), an "up" packet (PU) and a "down" packet (PD). Each of these parity packets is preferably computed by taking an XOR (exclusive-or, or ⊕) sum of specified combinations of data (e.g., bit-wise, byte-wise, or word-wise) in the preceding k data packets, where k is preferably more than 1. As defined above, the up and down packets, PU and PD, are cross-wise parity packets, while the straight packet, PS, is a straight parity packet.

In turn, at the receiving end, if a packet is lost, the associated payload may be extracted from the XOR sum carried by one or more subsequent data packets, due to the fact that, if A⊕B=C, then C⊕A=B and C⊕B=A. Consequently, if k data packets are XOR'ed together to derive a parity packet PP, and if one of the data packets is lost in transmission, that one data packet can be recovered at the receiving end by taking the XOR sum of all of the other data packets and the parity packet PP. Similarly, if the k data packets are XOR'ed together in two different ways to derive two different parity packets, $PP_1$ and $PP_2$, and if two of the data packets are lost in transmission, the two lost data packets can be recovered by solving the two equations defined by the XOR relationship between the payload and the respective parities.

While the preferred embodiment of the present invention is described in terms of applying the XOR function, the invention is not necessarily limited to using this function to combine data packets. As noted above and in the priority documents that have been incorporated by reference, the XOR function provides simplicity in packet recovery and is therefore the preferred function. However, other functions now known or later developed may alternatively be used to combine data packets for purposes of creating the necessary parities.

Preferred Parities

According to the preferred embodiment, the names "straight", "up" and "down" refer to the way the parities are calculated from the bits (or other units) of the preceding k data packets according to a preferred embodiment of the invention, when the k data packets are left aligned with each other and conceptually padded with zeros on the right to the extent necessary to equalize packet length.

Assuming that the data packets are made of bytes, a "straight" parity packet PS is preferably computed by taking the XOR sum along a straight line of bytes in the aligned packets (XOR'ing together the most significant bytes of all of the packets, XOR'ing together the next most significant bytes of all of the packets, and so forth); an "up" parity packet PU is preferably computed by taking the XOR sum along a +45° diagonal line of bytes in the aligned packets; and a "down" parity packet PD is preferably computed by taking the XOR sum along a −45° diagonal line of bytes in the aligned packets.

For simplicity of illustration, assume that k=4 and that the 4 data packets to be coded and transmitted are (byte wise):

$D_1$: [001][004][105][203][255]

$D_1$: [234][230][124]

$D_2$: [127][002][019][045]

$D_3$: [145][003][002][194]

An encoder operating in accordance with the preferred embodiment will first append to a copy of each data packet an indication of the packet length (if packet length might vary). This length information may then be used by a decoder to ensure that recovered data packets are the appropriate length (since the decoding process may otherwise append excess zeros to some recovered packets, as will be discussed below). Thus, in the above example, the coder would generate the following data structures, where the numbers shown here in the left-most positions of each packet indicate the respective packet lengths:

$D_0$: [005][001][004][105][203][255]

$D_1$: [003][234][230][124]

$D_2$: [004][127][002][019][045]

$D_3$: [004][145][003][002][194]

To derive PS, conceptually, a preferred encoder calculates the parity of bytes along straight up and down lines (such as from top to bottom column-wise), and, for each line, puts the result into a position in PS along the same line. In the above example, for instance, a coder would derive PS as follows:

$D_0$: [005][001][004][105][203][255]

$D_1$: [003][234][230][124]

$D_2$: [004][127][002][019][045]

$D_3$: [004][145][003][002][194]

PS: [006][005][227][004][036][225], where, for the most significant column, $[005]\oplus[003]\oplus[004]\oplus[004]=[006]$; for the next column, $[001]\oplus[234]\oplus[127]\oplus[145]=[005]$; and, for the least significant column, $[225]\oplus[000]\oplus[000]\oplus[000]=[225]$.

To derive PU, conceptually, a preferred encoder calculates the parity bytes along +45° diagonal lines, and, for each line, puts the result into a position in PU along the same +45° line. Thus, again in the above example, for instance, a coder would derive PU as follows:

| | | | | | | | | |
|---|---|---|---|---|---|---|---|---|
| PU: | | [005] | [002] | [234] | [244] | [036] | [239] | [047] | [194] |
| $D_0$: | [005] | [001] | [004] | [105] | [203] | [255] | | | |
| $D_1$: | [003] | [234] | [230] | [124] | | | | | |
| $D_2$: | [004] | [#27] | [002] | [019] | [045] | | | | |
| $D_3$: | [004] | [145] | [003] | [002] | [194] | | | | | where the following XOR sums are taken along +45° diagonal lines:

[005]=[005], $[003]\oplus[001]=[002]$, $[004]\oplus[234]\oplus[004]=[234]$, $[004]\oplus[127]\oplus[230]\oplus[105]=[244]$, $[145]\oplus[002]\oplus[124]\beta[203]=[036]$, $[003]\oplus[019]\oplus[000]\beta[255]=[239]$, $[002]\oplus[045]\oplus[000]\oplus[000]=[047]$, and $[194]\oplus[000]\oplus[000]\oplus[000]=[194]$.

As shown by this example, PU can be longer than the longest data packet (which, in this case, is $D_0$). In this regard, it is possible to establish that, in the worst case, PU (and also PD, which will be described below), will be only k−1 bytes longer than the longest data packet (assuming the XOR computation is done byte-wise), while PS will always be the same length as the longest data packet. This adds to the efficiency of the present invention.

To derive PD, conceptually, a preferred encoder works in a similar fashion, except along −45° lines rather than +45° lines. The preferred encoder calculates the panty bytes along −45° diagonal lines, and, for each line, puts the result into a position in PD along the same −45° line. Thus, again in the above example, a coder would derive PD as follows:

| | | | | | | |
|---|---|---|---|---|---|---|
| $D_0$: | [005] | [001] | [004] | [105] | [203] | [255] |
| $D_1$: | [003] | [234] | [230] | [124] | | |
| $D_2$: | [004] | [127] | [002] | [019] | [045] | |

| | | | | | | | | |
|---|---|---|---|---|---|---|---|---|
| $D_3$: | [004] | [145] | [003] | [002] | [194] | | | |
| PD: | | [004] | [149] | [127] | [239] | [054] | [085] | [105] | [203] |
| | [255], | | | | | | | | where, for instance, [005]⊕[234]⊕[002]⊕[002]=[239].

For purposes of reference, the bytes of these various data packets and parity packets may be referenced by an index j, such that the most significant byte of each packet has an index of i=0, the next most significant byte has an index of i=1, and so forth. Consequently, when the packets are aligned as shown above, for instance, $D_2(2)$=[002], PS(2) [227], PU(2)=[234], and PD(2)=[127]. Notice that, using this index, the PU and PD bytes in a given column as aligned above have shifted indexes compared with the data packet bytes in the same column.

Illustrative Encoder Operation

An encoder operating in accordance with the present invention may compute and transmit PS, PU and PD in any of a number of ways. Conceptually, the simplest way to do so may be to store a copy of each incoming packet in memory, transmit the incoming packet to maintain a steady transmission flow, and, once k packets have been stored in memory, compute and transmit PS, PU and PD for those k packets. As discussed above, the encoder may either transmit the parity packets individually or concatenate the parity packets with payload in the next window for transmission.

In the preferred embodiment, however, because the XOR operation is associative, an encoder may more efficiently calculate PS, PU and PD "on the fly," as data packets arrive at the encoder. Consider PS as an example. A preferred encoder begins by designating a memory location to store PS and initializes PS to zero. When the first of k data packets arrives, the encoder computes the XOR sum (along a straight line) of that first packet (with its length appended) and the currently stored value of PS, and the encoder transmits the data packet into the network, when the next data arrives, the encoder similarly computes the XOR sum of that next packet (with its length appended) and the currently stored value of PS, and the encoder transmits that next packet into the network; and so forth, through the last of the k data packets. Once the encoder has XOR'ed all of the k packets together along straight lines (columns), to compute PS, the encoder has derived a proper preferred value of PS. The encoder may then transmit the stored value of PS into the network.

The preferred encoder operates similarly to calculate values of PU and PD on the fly (perhaps simultaneously with its calculation of PS). To compute PU, the encoder initializes a PU memory location to zero and then sequentially XOR's each of the k incoming packets (with their lengths appended) along +45° diagonal lines with the stored value of PU. To compute PD, the encoder initializes a PD memory location to zero and then sequentially XOR's each of the k incoming packets (with their lengths appended) along −45° diagonal lines with the stored value of PD. The encoder may then transmit the stored values of PU and PD into the network.

FIG. 1 summarizes the process flow of an encoder operating in accordance with a preferred embodiment of the present invention. As shown at step 12 in FIG. 1, the encoder waits for a new data packet to arrive at its in-box. When a new data packet arrives, at step 14, the encoder receives the new packet. At steps 16 and 18, the encoder checks if the memory locations for the PS, PU and PD parities are empty (e.g., null) and, if so, initializes the parities to zero. At step 20, the encoder appends the length of the packet to a copy of the packet, and, at step 22, the encoder XOR's the resulting value with the PS, PU and PD parities as required (using straight lines for PS but up and down diagonal lines, respectively, for PU and PD). At step 24, the encoder adds a sequence number to the packet and, at step 26, the encoder puts the packet in the out box for transmission into the network.

At step 28, the encoder determines whether k packets have arrived and been processed. If not, then, at step 40, the encoder increments the sequence number and, at step 12, the encoder again waits until a new packet arrives at the in-box. If so, however, then, at steps 30 and 32, the encoder increments the sequence number and adds the sequence number to one of the parities. At step 34, the encoder puts the numbered parity in the out box for transmission into the network, and, at step 36, the encoder empties the memory location for that parity. At step 38, the encoder then determines whether more parities have been computed and need to be transmitted. If so, the encoder returns to step 30 to number, transmit and empty the next parity. If not, however, the encoder increments the sequence number and returns to step 12 to wait for a new packet to arrive at the in-box.

Illustrative Decoder Operation

A decoder operating in accordance with a preferred embodiment of the present invention is somewhat more complex than the encoder, principally because the decoder should be able to handle many different scenarios of packet loss. A preferred decoder should be able to recover as many lost data packets in a given window as there are parity packets for the window, and the decoder should be able recover the lost data packets based on different combinations of successfully received parity packets.

With data encoded as described above, three parity packets exist for each window of k data packets. If only one of these parity packets (PS, PU or PD) successfully arrives at the decoder, then, by employing the XOR operation, the decoder should be able to recover from the loss of at most any one of the k data packets. If any two of the parity packets (PS and PU, PS and PD, or PU and PD) successfully arrive at the decoder, then the decoder should be able to recover from the loss of up to any two of the k data packets. If all three of the parity packets (PS, PU and PD) successfully arrive at the decoder, then the decoder should be able to recover from m the loss of up to any three of the k data packets.

As an example, consider the data described above with respect to the preferred encoder. Assume that data packet D, is lost in transmission, but that the decoder receives the "up" parity packet PU. The decoder thus knows the following information (with unknown information indicated by question marks):

| | | | | | | | | |
|---|---|---|---|---|---|---|---|---|
| PU: | | [005] | [002] | [234] | [244] | [036] | [239] | [047] | [194] |
| $D_0$: | [005] | [001] | [004] | [105] | [203] | [255] | | |
| $D_1$: | [???] | [???] | [???] | [???] | [???] | [???] | [???] | |
| $D_2$: | [004] | [127] | [002] | [019] | [045] | | | |
| $D_3$: | [004] | [145] | [003] | [002] | [194]. | | | |

By calculating the XOR sums along +45° diagonal lines of the data that arrived and the PU parity packet, the decoder may compute each of the missing bytes of the lost data packet $D_1(0) \ldots D_1(6)$. For instance, beginning at the lower left corner, the decoder knows from the definition of PU that:

$$D_3(0) \oplus D_2(1) \oplus D_1(2) \oplus D_0(3) = PU(3).$$

Therefore, it follows that $D_1(2)$ can be computed as follows:

$$D_1(2) = D_3(0) \oplus D_2(1) \oplus D_0(3) \oplus PU(3),$$

or $$D_1(2) = [004] \oplus [127] \oplus [105] \oplus [244] = [230].$$

Similarly, for example, the decoder may compute $D_1(0)$ as follows:

$$D_1(0) = D_1(1) \oplus PU(1),$$

or $$D_1(0) = [001] \oplus [002] = [003],$$

and the decoder may compute $D_1(5)$ as follows:

$$D_1(5) = D_3(3) \oplus D_2(5) \oplus D_0(6) \oplus PU(6),$$

or $$D_1(5) = [002] \oplus [045] \oplus [000] \oplus [047] = [000].$$

Continuing in this way, the decoder may quickly compute $D_1$ to be $$D_1: [003][234][230][124][000][000][000].$$

Notice that this recovered packet $D_1$ includes three excess zero bytes. These excess zero bytes arise as a result of the use of cross-wise parities. In the present example, for instance, because the cross-wise parity PU was computed on a +45° diagonal lines, one of the diagonal lines considered by the decoder stems from $D_3(4)$, which results in the right most excess zero.

In turn, the decoder may strip and read the first byte [003] of $D_1$ to determine that the length of data packet $D_1$ is in fact 3 bytes. Therefore, the decoder may strip off the excess zeros, to recover the original $D_1 = [234][230][124]$.

The decoder becomes more complex in the instance where two of the k data packets are lost, as the decoder must be able to recover the two lost packets based on any two of the three parity packets associated with the window. For purposes of illustration, assume that $D_0$ and $D_2$ are lost in transmission, but that PS and PU have successfully arrived at the decoder. The decoder thus knows the following information:

| PU:  |       | [005] | [002] | [234] | [244] | [036] | [239] | [047] | [194] |
|------|-------|-------|-------|-------|-------|-------|-------|-------|-------|
| $D_1$: | [003] | [234] | [230] | [124] |       |       |       |       |       |
| $D_1$: | [???] | [???] | [???] | [???] | [???] | [???] |       |       |       |
| $D_2$: | [???] | [???] | [???] | [???] | [???] | [???] |       |       |       |
| $D_3$: | [004] | [145] | [003] | [002] | [194] |       |       |       |       |
| PS:  | [006] | [005] | [227] | [004] | [036] | [225] |       |       |       |

In this example, the decoder can immediately recover $D_0(0)$ from PU(0) by taking the null XOR sum along a +45° diagonal line, such that $D_0(0) = PU(0) = [005]$.

The decoder may then recover $D_2(0)$ from PS by taking the XOR sum along a straight line, such that:

$$D_2(0) = D_0(0) \oplus D_1(0) \oplus D_3(0) \oplus PS(0),$$

or $$D_2(0) = [005] \oplus [003] \oplus [004] \oplus [006] = [004].$$

As a consequence, the decoder has now recovered the first column and therefore knows the following:

| PU:  |       | [005] | [002] | [234] | [244] | [036] | [239] | [047] | [194] |
|------|-------|-------|-------|-------|-------|-------|-------|-------|-------|
| $D_0$: | [005] | [???] | [???] | [???] | [???] | [???] |       |       |       |
| $D_1$: | [003] | [234] | [230] | [124] |       |       |       |       |       |
| $D_2$: | [004] | [???] | [???] | [???] | [???] | [???] |       |       |       |
| $D_3$: | [004] | [145] | [003] | [002] | [194] |       |       |       |       |
| PS:  | [003] | [005] | [227] | [004] | [036] | [225] |       |       |       |

Next, the decoder may repeat the same process to recover the missing bytes in the second column, and so forth, until the decoder has recovered all of the following information:

$$D_0: [005][001][004][105][203][255]$$

$$D_1: [003][234][230][124]$$

$$D_2: [004][127][002][019][045][000]$$

$$D_3: [004][145][003][002][194]$$

The decoder may then strip off and apply the length information to remove the excess zeros, thereby determining that the lost data packets $D_0$ and $D_2$ were:

$$D_0: [001][004][105][203][255]$$

$$D_2: [127][002][019][045].$$

The decoder becomes yet more complex in the situation where three of the k data packets are lost in transmission and all three parity packets successfully arrive at the decoder. For purposes of example, assume that $D_0$, $D_1$ and $D_3$ are lost in transmission. In that case, the decoder knows only the following information:

| PU:  |       | [005] | [002] | [234] | [244] | [036] | [239] | [047] | [194] |
|------|-------|-------|-------|-------|-------|-------|-------|-------|-------|
| $D_0$: | [???] | [???] | [???] | [???] | [???] | [???] |       |       |       |
| $D_1$: | [???] | [???] | [???] | [???] | [???] | [???] |       |       |       |
| $D_2$: | [004] | [127] | [002] | [019] | [045] |       |       |       |       |
| $D_3$: | [???] | [???] | [???] | [???] | [???] | [???] |       |       |       |
| PD:  |       | [004] | [149] | [127] | [239] | [054] | [085] | [105] | [203] [255] |
| PS:  | [006] | [005] | [227] | [004] | [036] | [225]. |       |       |       |

Again, in this example, the decoder can immediately recover $D_0(0) = PU(0) = [005]$. In addition, along the −45° diagonal line, the decoder can immediately recover $D_3(0) = PD(0) = [004]$.

In turn, the decoder may compute $D_1(0)$ from PS by taking the XOR sum along a straight line, such that:

$$D_1(0) = D_0(0) \oplus D_2(0) \oplus D_3(0) \oplus PS(0),$$

or $$D_1(0) = [005] \oplus [004] \oplus [004] \oplus [006] = [003].$$

Consequently, the decoder has recovered the entire first column and knows the following:

| PU:  |       | [005] | [002] | [234] | [244] | [036] | [239] | [047] | [194] |
|------|-------|-------|-------|-------|-------|-------|-------|-------|-------|
| $D_0$: | [005] | [???] | [???] | [???] | [???] | [???] |       |       |       |
| $D_1$: | [003] | [???] | [???] | [???] | [???] | [???] |       |       |       |
| $D_2$: | [004] | [127] | [002] | [019] | [045] |       |       |       |       |

-continued

| | | | | | | |
|---|---|---|---|---|---|---|
| $D_3$: | [004] | [???] | [???] | [???] | [???] | [???] |
| PD: | | [004] | [149] | [127] | [239] | [054] | [085] | [105] | [203] [255] |
| PS: | [006] | [005] | [227] | [004] | [036] | [225]. |

Next, the decoder may repeat the same process to recover the missing bytes in the second column, and so forth, until the decoder has recovered all of the following information:

$D_0$: [005][001][004][105][203][255]

$D_1$: [003][234][230][124][000][000]

$D_2$: [004][127][002][019][045]

$D_3$: [004][145][003][002][194][000].

Again, the decoder may then strip off and apply the length information to remove the excess zeros, thereby determining that the lost data packets $D_0$ and $D_1$ and $D_3$ were:

$D_0$: [001][004][105][203][255]

$D_1$: [234][230][124]

$D_3$: [145][003][002][194].

The above examples serve to explain clearly how a decoder could operate in accordance with the present invention. However, because the examples operate on all of the available packets at once, the examples assume that all of the data packets are buffered. As a more efficient implementation of the invention, the preferred embodiment instead contemplates designating memory spaces for each of the parity packets, and then XOR'ing each incoming packet—shifted as necessary in the cases of PU and PD—into the designated memory locations. Once the decoder has received all of the information that it needs, the decoder may then iteratively cycle through the stored values to recover the lost data.

A simple example may serve to explain the operation of this preferred decoder. Assume, for purposes of this example, that the encoder computed parity packets PS and PU based on four thee-bit long data packets $D_0$... $D_3$, and transmitted all of these data and parity packets into the network destined for the receiving end. Assume that data packets $D_1$ and $D_3$ are lost in transmission but that the other data packets and the two parity packets arrive successfully at the decoder.

In this example, the decoder begins by designating memory spaces for so-called "parity" values, PU and PS. The decoder will use these memory spaces to build values for use in equations that will define up to two lost data packets (the maximum number of data packets that can be recovered provided with only two parity packets). The decoder will do so successively by XOR'ing incoming packets, shifted or non-shifted as necessary, into these two memory spaces. In this regard, in order to XOR a value A into a memory space that currently holds a value B, the decoder preferably computes the XOR sum of A⊕B and stores the result in the memory space as the new value of B.

Assume that data packet $D_0$ arrives first. Upon receipt of $D_0$, the decoder stores a non-shifted version of $D_0$ into the "PS" memory space (since PS is taken along a straight line), and the decoder stores $D_0$ shifted by zero bits into the "PU" memory space (since PU is taken along a +45° line). Next, assume data packet $D_2$ arrives. Upon receipt of $D_2$, the decoder XOR's into the "PS" memory space a non-shifted version of $D_2$, and the decoder stores $D_2$ shifted by 2 bits into the "PU" memory space. Next, assume that PS and PU arrive. Upon receipt of PS, the decoder XOR's PS into the "PS" memory space. Upon receipt of PU, the decoder XOR's PU into the "PU" memory space.

At this point, the decoder will have sufficient information to recover the missing two data packets, $D_1$ and $D_3$. In particular, based on the known definition of PU, the decoder knows that the XOR sum of the "PU" memory space and a once-shifted version of D, will be equal to a three times shifted $D_3$. Additionally, based on the known definition of PS, the decoder knows that the XOR sum of the "PS" memory space and a non-shifted version of $D_3$ will be equal to an non-shifted version of $D_1$. By iteratively cycling through the bytes of the "PU" and "PS" memory spaces and solving these two equations, the decoder may thus readily recover the lost data packets $D_1$ and $D_3$.

As those skilled in the art know, packets transmitted into a packet switched network will not necessarily arrive at the receiving end in the order transmitted. As a result, a decoder operating in accordance with the present invention might receive a packet belonging to a future or past window instead while the decoder is attempting to recover lost packets from a current window.

According to the preferred embodiment, a decoder may the avoid the complexity of handling packets from future or past windows by buffering the packets in each window separately and by moving on to a new window as soon as a packet from a new window arrives. More particularly, if a data packet arrives late (after the decoder has already moved onto another window), the decoder may forward the data packet directly to the receiver (with its packet length and sequence number removed). If a parity packet arrives late, the decoder may simply disregard it. If, however, any packet arrives early (i.e., before the decoder has finished decoding a current window), the decoder may treat the new packet as the beginning of a new window and may initialize the new window, disregarding the past window.

Experiments have shown that, in Internet transmissions, packets rarely arrive at a receiver out of order. Therefore, the strategy of ignoring a past window once a packet from a new window arrives will have little if any adverse impact on transmissions through the Internet.

Figure 3:
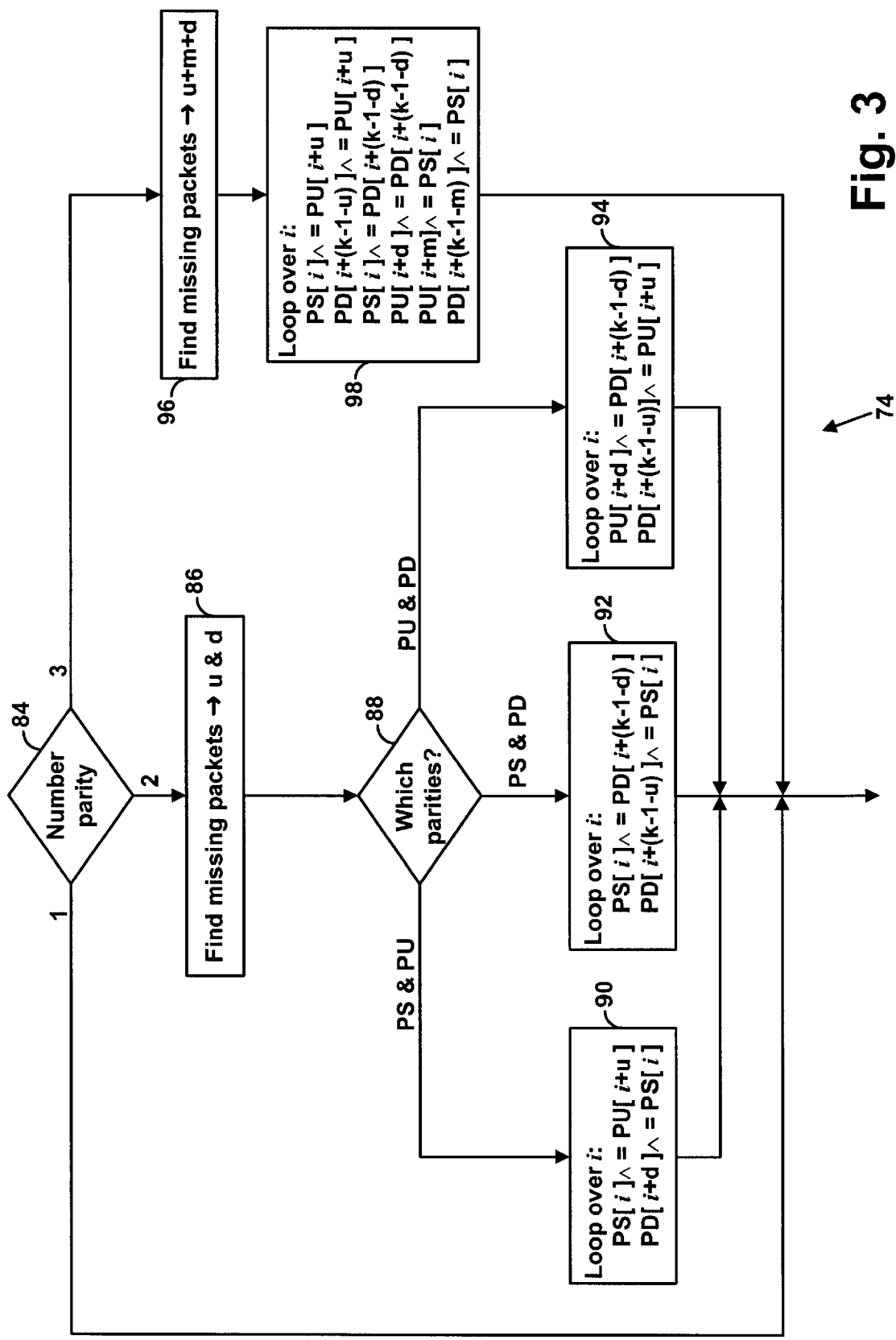
FIG. 3 depicts a preferred process flow for carrying out the packet recovery step 74 shown in FIG. 2.

FIG. 3 summarizes the process flow of a decoder operating in accordance with the foregoing preferred implementation of the present invention. For purposes of illustration, this process flow is based on the assumption that the encoder generated a straight parity (PS) and two cross-wise parities (PU and PD) based on a window of k data packets. The process flow further assumes, for purposes of example, that the packets are divided into bytes that may be referenced by the index i, beginning with i=0 for the most significant byte, i=1 for the next most significant byte, and so forth.

Figure 2:
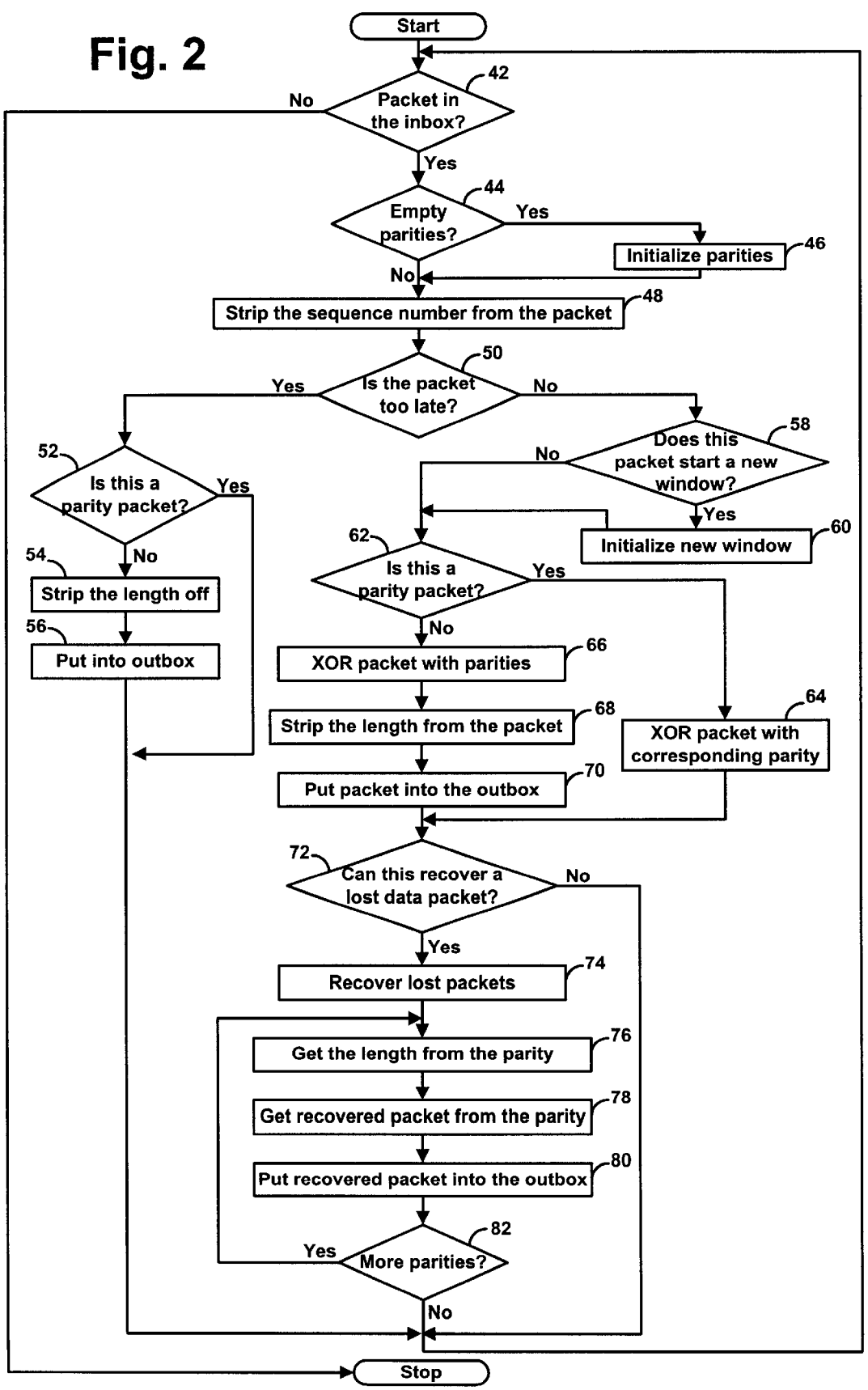
FIG. 2 depicts the process flow of a decoder operating in accordance with a preferred embodiment of the present invention.

As shown at step 42 in FIG. 2, the decoder begins by waiting for a new packet to arrive at its in-box. When a new packet arrives, at step 44, the decoder determines whether memory spaces already exist for PS, PU and PD. If not, then, at step 46, the decoder initializes a "PS" memory space, a "PU" memory space, and a "PD" memory space. If these memory spaces are initialized, then, at step 48, the decoder next strips the sequence number from the packet, while storing a copy of the sequence number for subsequent reference.

At step 50, the decoder next determines whether the packet is associated with a past window. If so, then, at step 52, the decoder checks whether the packet is a past parity packet or a past data packet. If the packet is a past parity packet, the decoder ignores it. If the packet is a past data packet, however, then, at steps 54–56, the decoder strips the length information from the packet and places the packet in the out box for transmission to the receiver. If the packet is not associated with a past window, then the decoder continues at step 58.

At step 58, the decoder determines whether the packet is associated with a new window. If so, then, at step 60, the decoder initializes a new window, thereby discontinuing any work associated with the previously current window.

At step 62, the decoder determines whether the packet is a parity packet. If so, then, at step 64, the decoder XOR's the packet with the corresponding parity memory space. For instance, if the packet is the PU parity, then the decoder will XOR it into the "PU" memory space. If the packet is not a parity packet, however, then, at step 66, the decoder XOR's the packet with each of the parity memory spaces, shifted if necessary as described above. At steps 68–70, the decoder then strips the length information from the packet and places the packet in the out box for transmission to the receiver, thereby maintaining continuous data transmission.

At step 72, the decoder next determines whether it can yet recover a lost data packet, in view of the fact that the decoder can recover only as many lost data packets as the number of associated parity packets that it has received. If so, then, at step 74, the decoder solves the equations defined by the values in the parity memory spaces, to recover the lost data packet(s). In turn, at steps 76–82, for each recovered data packet, the decoder then retrieves the appropriate length data packet as defined by the length byte in the packet, and places the recovered data packet in the out box for transmission to the receiver.

FIG. 3 illustrates in detail a preferred process flow for carrying out the packet recovery step 74 shown in FIG. 2. Referring to FIG. 3, at step 84, the decoder determines how many parity packets it has received. The process of recovering lost data packets will vary depending on the number of parity packets received.

If the decoder has received only one parity packet, then the decoder can recover at most one lost data packet. In this case, the memory space corresponding to that one parity packet already contains the missing data packet (shifted in the case of PU or PD), because all of the other data packets (by necessity) have already been XOR'ed together with the actual parity value into that memory space. Therefore, the decoder has finished recovering the lost data packet.

If the decoder has received two parity packets, then the decoder can recover up to two lost data packets. In that case, the decoder will apply an iterative recovery algorithm that will vary depending on which two parity packets it received. First, at step 86, the decoder will identify which data packets are missing. Considering that the window at issue contains a sequence of data packets $D_i = \{D_0, D_1, D_2, \ldots D_{k-1}\}$, the decoder will identify the data packet indexes of the two missing data packets and assign those indexes to values. For purposes of illustration, the process flow shown in FIG. 3 assumes that the decoder designates the smaller index (or "up" index) as "u" and the larger index (or "down" index) as "d". For instance, if data packets $D_1$ and $D_3$ have been lost in transmission, the preferred decoder would set u=1, and d=3.

At step 88, the decoder next identifies which two parities it has received. The possible combinations are PS and PU, PS and PD, or PU and PD. Depending on which combination of parities it received, at step 90, 92 or 94, the decoder then applies the following algorithms iteratively over the index i:

If the decoder received parities PS and PU, then, at step 90, loop over i:

$$PS(i) = PS(i) \oplus PU(i+u)$$

$$PU(i+d) = PU(i+d) \oplus PS(i)$$

If the decoder received parities PS and PD, then, at step 92, loop over i:

$$PS(i) = PS(i) \oplus PD(i+(k-1-d))$$

$$PD(i+(k-1-u)) = PD(i+(k-1-u)) \oplus PS(i)$$

If the decoder received parities PU and PD, then, at step 94, loop over i:

$$PU(i+d) = PU(i+d) \oplus PD(i+(k-1-d))$$

$$PD(i+(k-1-u)) = PD(i+(k-1-u)) \oplus PU(i+u)$$

Once the decoder completes these iterative recovery algorithms, the values of the missing data packets will be stored in the respective parity memory spaces (shifted, in the case of PU or PD).

If, however, the decoder received all three of the parity packets, then the decoder can recover up to three lost data packets. At step 96, the decoder will identify the data packet indexes of the three missing data packets and assign those indexes to values. For purposes of illustration, the process flow shown in FIG. 3 assumes that the decoder designates the smaller index (or "up" index) as "u", the middle index as "in", and the larger index (or "down" index) as "d". For instance, if data packets $D_0$, $D_2$ and $D_3$ are lost in transmission, the preferred decoder would set u=0, m=2, and d=3. At step 98, the decoder then iteratively applies the following algorithm over the index i:

$$PS(i) = PS(i) \oplus (B\ PU(i+u)$$

$$PD(i+(k-1-u)) = PD(i+(k-1-u)) \oplus PU(i+u)$$

$$PS(i) = PS(i) \oplus PD(i+(k-1-d))$$

$$PU(i+d) = PU(i+d) \oplus PD(i+(k-1-d))$$

$$PU(i+m) = PU(i+m) \oplus PS(i)$$

$$PD(i+(k-1-n)) = PD(i+(k-1-n)) \oplus PS(i)$$

Once the decoder completes this iterative recovery algorithm, the values of the three missing data packets will be stored in the three parity memory spaces (shifted, in the case of PU or PD).

Alternative Embodiment—Omitting Packet Length

As described above, a preferred embodiment of the present invention calls for appending the packet length to each data packet. The decoder uses this length to know where to truncate excess zeros that the decoding process may add to recovered data packets. Without this length information, a decoder may truncate too much of the recovered data, if the right-most piece or pieces of the actual data are themselves zero. For instance, assume that an original data packet actually consists of the data {8, 9, 3, 0, 0}, and assume that step 74 of the decoding process results in a recovered value for that data packet of {8, 9, 3, 0, 0, 0, 0}, which includes two excess zeros due to the use of cross-wise parities. Without knowing the length of the original data packet, the decoder would not know whether to truncate the three right-most zeros, or—properly—only two of the right-most zeros.

According to a modified version of the present invention, however, it is possible to avoid having to add packet length information to each transmitted data packet, provided that each data packet necessarily includes a non-zero piece of information in a known location. Many protocols satisfy this criterion by requiring that each transmitted packet include certain non-zero information at a set location in the packet header. According to TCP, for instance, every packet header must include a one-byte indication of the TCP version and header length, and this one-byte, by definition, can never be zero. Similarly, according to UDP, every packet header must include a two-byte indication of the header length, which also must be non-zero.

According to the alternative embodiment, instead of appending packet length information to each packet, a preferred encoder may swap the necessarily non-zero information with an equally sized piece of data at the right end of the data packet. Thus, for instance, assume that the it packet header necessarily includes a non-zero header-length designated by a byte "H", and the packet data consists of the byte values {8, 9, 3, 0, 0}. For ease of understanding, assume then that the entire packet, including the header, consists of the set {H, 8, 9, 3, 0, 0}. The preferred encoder would transmit this unmodified data packet into the network, without appending an indication of the packet length. However, for purposes of deriving the parity or parities based in 1.3S part on this data packet, the preferred encoder will swap the non-zero "H" byte with the right-most "0" byte, to obtain the modified data packet consisting of the set {0, 8, 9, 3, 0, H}.

Assume next that this data packet is lost in transmission and the step 74 of the decoding process results in a recovered value for this data packet of (0, 8, 9, 3, 0, H, 0, 0}, again including two excess zeros due to the use of cross-wise parities. To properly truncate any excess zeros from this resulting data packet, in this example, a preferred decoder may then simply strip off zeros from the right end until the decoder reaches the first non-zero byte. In turn, the decoder may then swap that first (right-most) non-zero byte with the actual end-piece that the encoder placed in the header.

Preferred Configuration and Sample Code

While an encoder or decoder operating in accordance with the present invention may take any of a variety of forms (such as hardware, software or firmware), both the encoding and decoding function steps as described above are preferably carried out by a computer processor or microprocessor operating a set of machine language instructions that are stored in a memory. For purposes of transmission through a packet switched network, the encoder and decoder processes will preferably be operated at transmitting and receiving ends of the network. For instance, and without limitation, the encoding process may be operated at a transmitting computer terminal, network server, hub or router, and the decoding process may be operated at a receiving computer terminal, network server, hub or router.

The incorporated microfiche appendix includes three separate appendixes, Appendix 1, Appendix 2 and Appendix 3. As an example, Appendix 1 sets forth a C44 source code listing for a preferred encoder and decoder, which can be compiled by any standard C++ compiler and executed by an appropriate processor. In addition, as another example, Appendix 2 sets forth a C++ source code listing for a less complex system configured to operate with only two parity packets (PS and PU, by way of example). Still further, as another example, Appendix 3 sets forth a C++ source code listing for the alternative embodiment of the invention, in which TCP header length information is swapped with the right-most byte in each data packet for purposes of computing the three preferred parities, PS, PU and PD. In Appendix 3, the IN_CKSUM.C routine is adapted from the public domain, as are some elements of the FAKETCP.CPP routine that relate to the TCP/IP stack.

As the foregoing illustrates, the present invention provides a computationally simple mechanism for encoding and decoding a sequence of packets in order to recover lost packets. A preferred embodiment of this invention has been illustrated and described. It will be understood, however, that changes and modifications may be made to the invention without deviating from the spirit and scope of the invention, as defined by the claims.

What is claimed is:

1. A method of communicating payload through a packet switched telecommunications network, said network including a first node and a second node, said payload defining a sequence of windows of k payload blocks, said sequence including a current window of k payload blocks and a subsequent window of k payload blocks, said method comprising, in combination:

at said first node, generating p parity blocks by an encoding process comprised of functionally combining together the k payload blocks of the current window, wherein $p \geq 1$, and wherein at least one of said p parity blocks comprises a cross-wise parity block derived as a function of said k payload blocks of said current window taken along an index-shifted path through said k payload blocks of said current window;

piggy-backing said p parity blocks onto a number of payload blocks in the subsequent window;

transmitting into the network the k payload blocks of the current window; and transmitting into the network the k payload blocks of the subsequent window, whereby the k payload blocks of the subsequent window includes the p parity blocks.

2. A method as claimed in claim 1, wherein said p parity blocks include an "up" parity block and a "down" parity packet.

3. A method as claimed in claim 2, wherein said p parity blocks include a "straight" parity block.

4. A method as claimed in claim 1, wherein said payload blocks cooperatively represent a real-time media signal comprising media selected from the group consisting of audio and video.

5. A method as claimed in claim 1, wherein said index-shifted path defines for each of said k payload blocks of said current window an extent to which said payload block is index-shifted.

6. A method as claimed in claim 5, wherein said function comprises an XOR sum.

7. A method as claimed in claim 5, wherein said index-shifted path comprises a ±45° diagonal line.

8. A method as claimed in claim 5, further comprising, in combination:

subsequently, at said second node, recovering r of said k payload blocks of said current window by employing a decoding process comprised of functionally combining together r of said p parity blocks and k−r of said k payload blocks of said current window.

9. A method as claimed in claim 8, wherein functionally combining said r parity blocks and said k−r payload blocks comprises index-shifting at least one of said k−r payload blocks.

10. A method as claimed in claim 8, wherein functionally combining said r payload blocks and said k−r payload blocks comprises computing an XOR sum.

11. A method as claimed in claim 8, wherein functionally combining said r parity blocks and said k−r payload blocks comprises, for each given one of said r parity blocks, (i) index-shifting each respective one of said k−r payload blocks to the same extent, if any, that said respective one of said k−r payload blocks was shifted in said encoding process, and (ii) computing an XOR sum of said k−r payload blocks and said given one of said r parity blocks.

12. A method as claimed in claim 8, wherein said decoding process further comprises designating a memory space for recovery of each of said r payload blocks.

13. A method of communicating data through a packet switched telecommunications network, said network including a first node and a second node, said data defining a sequence of windows of k data packets, wherein each data packet defines a set of segments and further defines a packet beginning and a packet end, said set of segments including (i) a first segment located at a predetermined location in said data packet, said first segment known to contain a non-zero value, and (ii) a second segment located at said packet end, and wherein said sequence includes a current window of k data packets and a subsequent window of k data packets, said method comprising, in combination:

at said first node, generating p parity blocks by an encoding process comprised of swapping said first and second segments in each of said k data packets of said current window and then functionally combining together the k data packets of the current window, wherein $p \geq 1$, and wherein at least one of said p parity blocks comprises a cross-wise parity block derived as a function of said k data packets of said current window taken along an index-shifted path through said k data packets of said current window;

piggy-backing said p parity blocks onto a number of data packets in the subsequent window;

transmitting into the network the k data packets of the current window; and transmitting into the network the k data packets of the subsequent window, whereby the k data packets of the subsequent window includes the p parity blocks.

14. A method as claimed in claim 13, wherein each of said data packets comprises a TCP packet having a TCP header, and said first segment is a non-zero header length and TCP version segment located in said TCP header.

15. A method as claimed in claim 13, wherein each of said data packets comprises a UDP packet.

16. A method as claimed in claim 13, further comprising, in combination:

subsequently, at said second node, recovering r of said k data packets of said current window by employing a decoding process comprised of functionally combining together r of said p parity blocks and k−r of said k data packets of said current window.

17. A method as claimed in claim 16, wherein said decoding process further comprises, after recovering a given data packet, stripping any excess zeros from the recovered data packet, and again swapping said first and second segments.

18. A method of communicating payload through a packet switched telecommunications network, said network including a first node and a second node, said payload defining windows of k payload blocks including a first window of k payload blocks and a second window of k payload blocks, said method comprising, in combination, for each of said windows:

at said first node, (i) generating p parity packets each based on said k payload blocks of said first window, wherein $p \geq 1$, and wherein at least one of said p parity packets comprises a cross-wise parity packet derived as a first function of said k payload blocks taken along an index-shifted path through said k data payload blocks, (ii) piggy-backing the p parity packets onto a number of payload blocks of said second window, (iii) forwarding into said network said k payload blocks of said first window, and (iv) forwarding into said network said number of payload blocks of said second window on which said p parity packets are piggy-backed; and at said second node, deriving r of said k payload blocks based on a second function of r of said parity packets and k−r of said k payload blocks of said first window.

19. A method as claimed in claim 18, wherein said first function comprises an XOR operation.

20. A method as claimed in claim 18, wherein said second function comprises an XOR operation.

21. A method as claimed in claim 18, wherein said index-shifted path comprises a ±45° diagonal line.

22. A method as claimed in claim 18, wherein said p parity packets include an "up" parity packet and a "down" parity packet.

23. A method as claimed in claim 22, wherein said p parity packets include a "straight" parity packet.

24. A method as claimed in claim 18, wherein said data blocks cooperatively represent a real-time media signal comprising media selected from the group consisting of audio and video.

25. A method of communicating data through a packet switched telecommunications network, said data being divided into a sequence of data blocks, said method comprising, in combination, for each of k data blocks in said sequence:

generating p parity blocks based on said k data blocks, wherein $p \geq 1$, and wherein at least one of said p parity blocks is a cross-wise parity block derived as a function of said k data blocks taken along an index-shifted path through said k data blocks;

combining the p parity blocks with a number of subsequent data blocks in said sequence; and forwarding into said network destined for a receiving end said k data blocks and said number of subsequent data blocks with which p parity blocks are combined.

26. A method as claimed in claim 25, wherein generating said cross-wise parity block comprises computing an XOR sum along an index-shifted path.

27. A method as claimed in claim 26, wherein said index-shifted path comprises a ±45° diagonal line.

28. A method of encoding a sequence of payload blocks in a telecommunications network to enable recovery of lost payload blocks, said method comprising, in combination:

deriving p parity blocks from each sequential group of k of said payload blocks, wherein $p \geq 1$, and wherein at least one of said p parity blocks comprises a cross-wise parity block derived as a function of said k payload blocks taken along an index-shifted path through said k payload blocks; and piggy-backing each of said p parity blocks, respectively, with a payload block in a subsequent sequential group of k of said payload blocks.

29. A method as claimed in claim 28, wherein said payload blocks cooperatively represent a real-time media signal comprising media selected from the group consisting of audio and video.

* * * * *